(12) United States Patent
Noh

(10) Patent No.: US 8,030,958 B2
(45) Date of Patent: Oct. 4, 2011

(54) SYSTEM FOR PROVIDING A REFERENCE VOLTAGE TO A SEMICONDUCTOR INTEGRATED CIRCUIT

(75) Inventor: Yong-hwan Noh, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1074 days.

(21) Appl. No.: 11/878,498

(22) Filed: Jul. 25, 2007

(65) Prior Publication Data

US 2008/0150615 A1 Jun. 26, 2008

(30) Foreign Application Priority Data

Dec. 21, 2006 (KR) .................. 10-2006-0132029

(51) Int. Cl.
*G01R 31/26* (2006.01)
(52) U.S. Cl. .......... 324/762.01; 324/756.06; 324/754.01
(58) Field of Classification Search .......... 324/754–765, 324/158.1; 327/535
See application file for complete search history.

(56) References Cited

U.S. PATENT DOCUMENTS

| | | | |
|---|---|---|---|
| 5,656,944 A | 8/1997 | Choi | |
| 5,959,463 A * | 9/1999 | Funakura et al. ............. | 324/765 |
| 6,185,139 B1 | 2/2001 | Pantelakis et al. | |
| 6,194,953 B1 | 2/2001 | Mueller | |
| 6,262,580 B1 * | 7/2001 | Wu ............................... | 324/713 |
| 6,262,588 B1 * | 7/2001 | Chen ............................. | 324/765 |
| 6,294,921 B1 * | 9/2001 | Bonaccio et al. .............. | 324/756 |
| 6,642,734 B1 * | 11/2003 | Tsuyuki et al. ................ | 324/765 |
| 6,781,362 B1 * | 8/2004 | Miyashita et al. ........ | 324/762.02 |
| 6,812,752 B2 * | 11/2004 | Lin ................................ | 327/143 |
| 6,876,218 B1 * | 4/2005 | Simmons et al. .............. | 324/763 |
| 7,737,718 B2 * | 6/2010 | Koura ....................... | 324/762.01 |
| 2002/0067179 A1 * | 6/2002 | Takasugi et al. .............. | 324/754 |
| 2003/0206044 A1 * | 11/2003 | Marshall et al. .............. | 327/205 |
| 2004/0104740 A1 * | 6/2004 | Burns et al. ................... | 324/763 |
| 2006/0038577 A1 * | 2/2006 | Jang .............................. | 324/763 |
| 2007/0135504 A1 * | 6/2007 | Marshall ........................ | 514/381 |

FOREIGN PATENT DOCUMENTS

| | | |
|---|---|---|
| JP | 05-232197 | 9/1993 |
| KR | 10-1997-0008141 B1 | 5/1997 |
| KR | 10-1998-081441 | 11/1998 |

* cited by examiner

*Primary Examiner* — Huy Q Phan
*Assistant Examiner* — Richard Isla-Rodas
(74) *Attorney, Agent, or Firm* — Lee & Morse, P.C.

(57) ABSTRACT

A system for providing a reference voltage includes a tester adapted to provide a predetermined current, a first ground pad connected to a ground voltage of the tester, a second ground pad connected between the tester and the first ground pad, the second ground pad being connected to the tester through first and second resistors, a reference voltage pad connected to a node between the first and second resistors, the reference voltage pad adapted to provide a test reference voltage, and a multiplexer connected to the reference voltage pad, the multiplexer configured to output the test reference voltage as a reference voltage during substantial voltage variation.

8 Claims, 2 Drawing Sheets

SYSTEM FOR PROVIDING A REFERENCE VOLTAGE TO A SEMICONDUCTOR INTEGRATED CIRCUIT

BACKGROUND OF THE INVENTION

1. Field of the Invention

Embodiments of the present invention relate to a semiconductor integrated circuit. More particularly, embodiments of the present invention relate to a system capable of providing a reference voltage to a semiconductor integrated circuit during reliability evaluation.

2. Description of the Related Art

In general, semiconductor integrated circuits may be employed to drive a variety of electronic devices. As a size of a semiconductor integrated circuit is decreased and its degree of integration is increased, power consumption thereof may increase. In part, the power consumption of the conventional semiconductor integrated circuit may increase during a reliability evaluation, e.g., burn-in test or a high-voltage margin evaluation, that may require a greater voltage as compared to a voltage required during normal circuit operation because of increased parasitic resistance generated during such evaluation. The parasitic resistances during conventional reliability evaluation of semiconductor integrated circuits may be generated by various parasitic components, e.g., resistance due to connection to a probe card, a contact, a printed circuit board (PCB), a test board, and so forth.

For example, a conventional semiconductor integrated circuit connected to a tester and having internal and ground voltage sources may include a first parasitic resistance between its internal voltage source and a voltage source of the tester, and a second parasitic resistance between its ground voltage and a ground voltage of the tester. Accordingly, a voltage difference between the internal source voltage and the internal ground voltage of the semiconductor integrated circuit may be lower than the voltage difference between the source voltage and the ground voltage of the tester. However, when a plurality of semiconductor integrated circuits are connected to a single tester, each such parasitic resistance may trigger different voltage drops in each one of the semiconductor integrated circuits due to variations in test conditions, current, and so forth. As such, each semiconductor integrated circuit may have a different voltage difference between the internal source voltage and the internal ground voltage, thereby minimizing uniformity of reliability evaluation of a plurality of semiconductor integrated circuits connected to the single tester.

Attempts have been made to employ an external reference voltage source, instead of the internal voltage source, during the reliability evaluation. However, such attempts have not provided for a constant internal ground voltage, thereby causing non-uniform voltage difference between the internal ground and source voltages. As such, uniform reliability evaluation of a plurality of semiconductor integrated circuits connected to a single tester has not been achieved.

SUMMARY OF THE INVENTION

Embodiments of the present invention are therefore directed to a system capable of providing a constant reference voltage to a semiconductor integrated circuit, which substantially overcomes one or more of the disadvantages of the related art.

It is therefore a feature of an embodiment of the present invention to provide a system capable of supplying a constant voltage difference between internal source and ground voltages of a plurality of chips regardless of variation in environment conditions thereof.

It is therefore another feature of an embodiment of the present invention to provide a semiconductor integrated circuit capable of generating an internal source voltage using a constant reference voltage.

At least one of the above and other features and advantages of the present invention may be realized by providing a system for generating a reference voltage, including a tester adapted to provide a current, a first ground pad connected to a ground voltage of the tester, a second ground pad connected between the tester and the first ground pad, the second ground pad being connected to the tester through first and second resistors, a reference voltage pad connected to a node between the first and second resistors, the reference voltage pad adapted to provide a test reference voltage, and a multiplexer connected to the reference voltage pad, the multiplexer configured to output the test reference voltage as a reference voltage during voltage variation.

The test reference voltage may have a voltage level that substantially equals a voltage drop across a parasitic resistance of the ground voltage of the tester and a voltage drop across the first resistor. The system may further include a test mode signal configured to output a signal to the multiplexer to indicate substantial voltage variation.

At least one of the above and other features and advantages of the present invention may be further realized by providing a semiconductor integrated circuit, including a first ground pad connected to a ground voltage of a tester, a second ground pad connected between the tester and the first ground pad, the second ground pad being connected to the tester through first and second resistors, a reference voltage pad connected to a node between the first and second resistors, and a multiplexer connected to the reference voltage pad, the multiplexer configured to output a normal reference voltage or a test reference voltage as a reference voltage.

The semiconductor integrated circuit may further include a test mode signal configured to output a signal to the multiplexer to indicate output of the test reference voltage as a reference voltage. Additionally, the semiconductor integrated circuit may include an internal voltage generating circuit configured to generate an internal voltage by comparing the internal voltage and the reference voltage. The tester may be configured to provide current to the second ground pad for a burn-in test or a high-voltage margin evaluation of the semiconductor integrated circuit. The reference voltage pad may have a voltage level that substantially equals a sum of a voltage drop across a parasitic resistance of the ground voltage and a voltage drop across the first resistance.

At least one of the above and other features and advantages of the present invention may be still be realized by a method of providing a reference voltage to a circuit, including receiving an internal ground voltage, generating a reference voltage in accordance with the internal ground voltage, and providing the reference voltage to an internal voltage generating circuit. Generating the reference voltage may include using a multiplexer configured to output a test reference voltage as the reference voltage during substantial voltage variation. Using a multiplexer may include employing a test mode signal configured to output a signal to the multiplexer to indicate substantial voltage variation. The method may further include generating an internal source voltage in accordance with the reference voltage.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
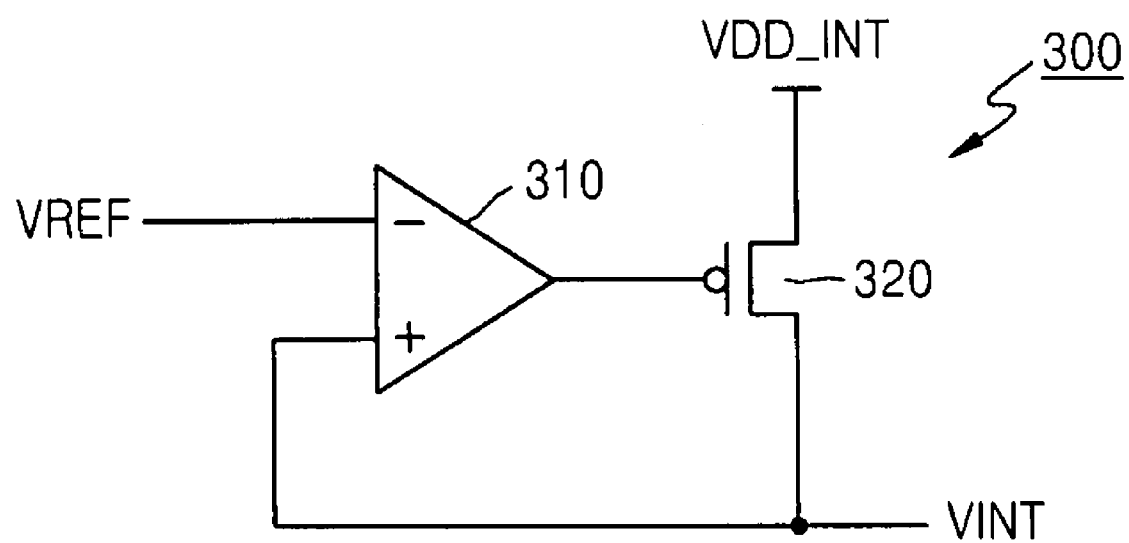
FIG. 1 illustrates a view of a conventional internal source voltage generating circuit.

Korean Patent Application No. 10-2006-0132029, filed on Dec. 21, 2006, in the Korean Intellectual Property Office, and entitled: "Apparatus for Providing Reference Voltage to Semiconductor Integrated Circuit," is incorporated by reference herein in its entirety.

Embodiments of the present invention will now be described more fully hereinafter with reference to the accompanying drawings, in which exemplary embodiments of the invention are illustrated. Aspect of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements may be exaggerated for clarity of illustration. It will also be understood that when an element is referred to as being "between" two elements, it can be the only element between the two elements, or one or more intervening elements may also be present. It will further be understood that when an element is referred to as being "coupled to" or "connected to" another element, it may be connected or coupled directly to the other element, or one or more intervening elements may also be present. Like reference numerals refer to like elements throughout.

According to an exemplary embodiment of the present invention a semiconductor integrated circuit may include a system capable of generating a constant internal ground voltage as an internal reference voltage when connected to a tester during a burn-in test or a high-voltage margin evaluation.

A conventional internal source voltage generating circuit 300, as illustrated in FIG. 1, may generate an internal source voltage VINT, i.e., voltage to operate a plurality of internal circuits, for a semiconductor chip. The internal source voltage generating circuit 300 may require a reference voltage VREF in order to control levels of the internal source voltage VINT, i.e., adjust the internal source voltage VINT to be equal to the reference voltage VREF via comparison therebetween by a comparator 310. The result of this comparison may be supplied to a transistor 320. When the internal source voltage VINT is lower than the reference voltage VREF, the transistor 320 may be turned on to receive the internal source voltage VINT. When the internal source voltage VINT is higher than the reference voltage VREF, the transistor may be turned off to decrease the internal source voltage VINT.

In accordance with an embodiment, levels of the internal source voltage VINT may be reduced via the reference voltage VREF during a reliability evaluation, e.g., a burn-in test or a high-voltage margin evaluation, by employing a reference voltage VREF generated in accordance with an internal ground voltage, as described in detail below.

Figure 2:
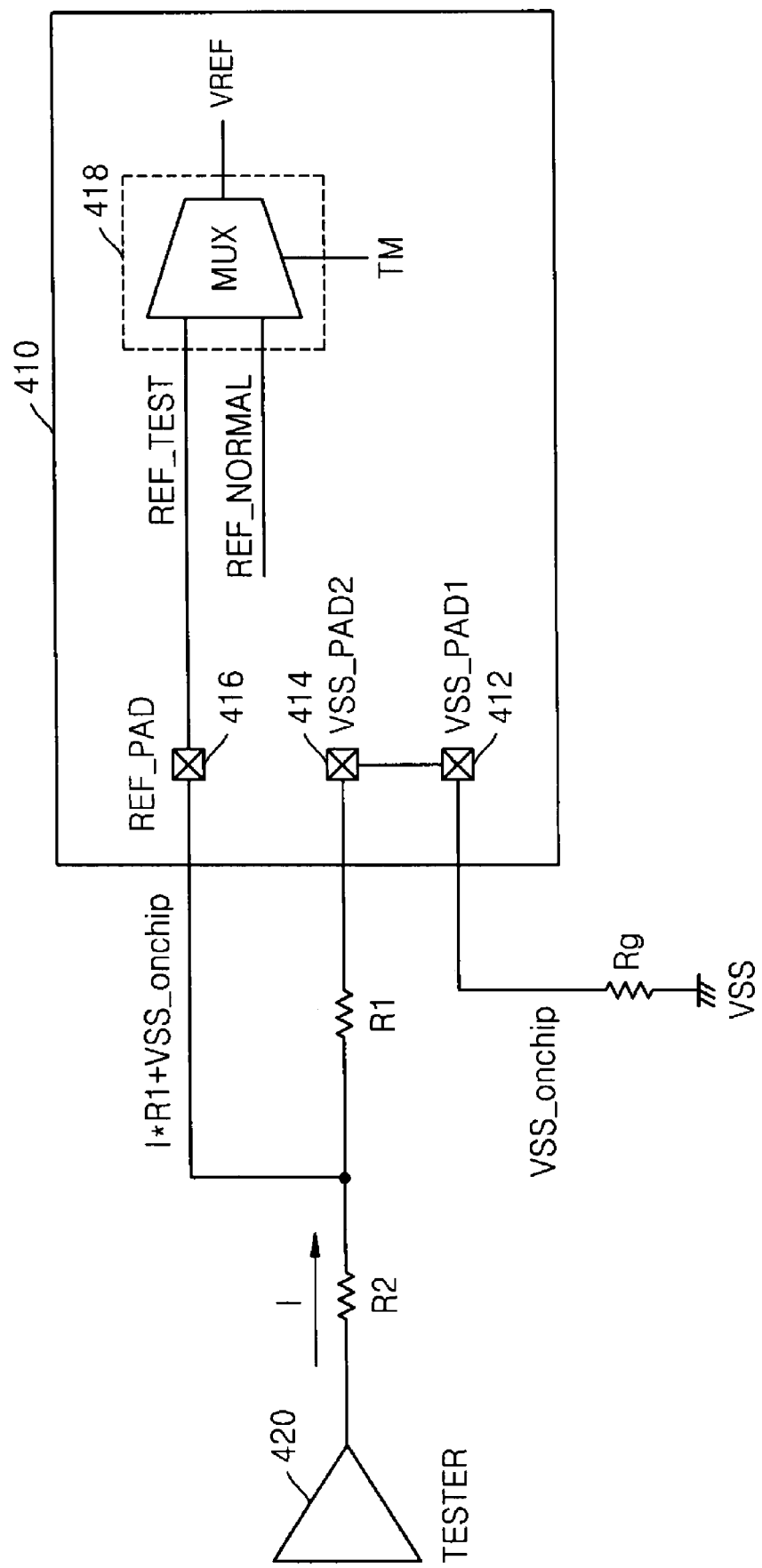
FIG. 2 illustrates a circuit diagram of a system for providing a constant reference voltage according to an embodiment of the present invention.

As illustrated in FIG. 2, a semiconductor integrated circuit, i.e., chip, 410 may include a system capable of generating a constant internal ground voltage when connected to a tester 420 during a burn-in test or a high-voltage margin evaluation. More specifically, the semiconductor integrated circuit 410 may include a first ground pad 412, a second ground pad 414, a reference voltage pad 416, and a multiplexer 418. The terms "semiconductor integrated circuit" and "semiconductor chip" may be used hereinafter interchangeably.

The first ground pad 412 of the semiconductor chip 410 may be connected between a ground voltage VSS of the tester 420 and the second ground pad 414, and may provide an internal ground voltage VSS_INT to the semiconductor chip 410. A parasitic resistance Rg may exist between the first ground pad 412 and the ground voltage VSS of the tester 420, thereby providing an on-chip ground voltage level of about VSS_onchip to the internal ground voltage VSS_INT.

The second ground pad 414 of the semiconductor chip 410 may be connected between the tester 420 and the first ground pad 412. The second ground pad 414 may be connected to the tester 420 through first and second resistors R1 and R2.

The reference voltage pad 416 of the semiconductor chip 410 may be connected between the multiplexer 418 and a node between the first and second resistors R1 and R2. The reference voltage pad 416 may provide a test reference voltage REF_TEST to the multiplexer 418. The test reference voltage REF_TEST may have a voltage level of about IxR1+VSS_onchip. More specifically, the voltage level of IxR1+VSS_on-chip may substantially equal a sum of the on-chip ground voltage level VSS_onchip of the internal ground voltage VSS_INT and a voltage drop across the first resistor R1, i.e., IxR1 caused by current I of the tester 420.

The multiplexer 418 of the semiconductor chip 410 may include at least three inputs and at least one output. The multiplexer 418 may receive a first input from the reference voltage pad 416, i.e., the test reference voltage REF_TEST, a second input signal, i.e., an internally generated normal reference voltage REF_NORMAL, and a third input signal, i.e., a test mode signal TM. The multiplexer 418 may output either the test reference voltage REF_TEST or the normal reference voltage REF_NORMAL as a reference voltage VINTREF with respect to substantial voltage variations, e.g., a substantial voltage increase during reliability evaluation, as indicated by the test mode signal TM.

For example, during normal operation of the semiconductor chip 410, the test mode signal TM may be disabled, so the multiplexer 418 may output the normal reference voltage REF_NORMAL, i.e., a signal generated internally in the semiconductor chip 410, as the reference voltage VINTREF. During reliability evaluation, e.g., the burn-in test or the high-voltage margin evaluation, the test mode signal TM may be enabled, so the multiplexer 418 may output the test reference voltage REF_TEST as the reference voltage VINTREF. In other words, during reliability evaluation, the reference voltage VINTREF may be used to compensate for an increased on-chip ground voltage level VSS_onchip of the internal ground voltage VSS_INT, thereby providing a constant internal ground voltage output. The reference voltage VINTREF may be output to the voltage generating circuit 300 described previously with respect to FIG. 1 as reference voltage VREF. Accordingly, a substantially constant value of internally generated voltage VINTREF may be continuously provided to the voltage generating circuit 300, regardless of parasitic resistance generated due to variations in process or test environment of the semiconductor chip 410, e.g., reliability evaluation. Accordingly, a constant voltage difference between the internal source voltages VDD_INT and internal ground voltage VSS_INT may be achieved.

When a plurality of semiconductor chips having different on-chip ground voltages VSS_onchip, i.e., each semiconductor chip may have a different on-chip ground voltage VSS_onchip due to process variations and/or the test conditions, are connected to a single tester, each semiconductor chip may generate a corresponding reference voltage VIN- TREF to compensate for a respective on-chip ground voltage VSS_onchip through a respective reference voltage pad 416. Further, each corresponding reference voltage VINTREF may provide an internal reference voltage to adjust the internal voltage VINT, so that the voltage difference between the internal source voltages VDD_INT and internal ground voltage VSS_INT may be constant, and may be defined as IxR1.

A system according to embodiments of the present invention may be advantageous in providing a substantially constant reference voltage to adjust an internal ground voltage, thereby providing an internal reference voltage to a voltage generating circuit. Further, the constant reference voltage of the internal ground voltage may provide a constant voltage difference between the internal source and ground voltages of a plurality of connected semiconductor chips during the burn-in test or the high-voltage margin evaluation, thereby providing increased reliability thereof.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A system for providing a reference voltage, comprising:
   a tester adapted to provide a current;
   a first ground pad connected to a ground voltage of the tester;
   a second ground pad connected between the tester and the first ground pad, the second ground pad being connected to the tester through first and second resistors;
   a reference voltage pad connected to a node between the first and second resistors, the reference voltage pad adapted to provide a test reference voltage; and
   a multiplexer connected to the reference voltage pad, the multiplexer configured to output the test reference voltage as a reference voltage during substantial voltage variation.

2. The system as claimed in claim 1, wherein the test reference voltage has a voltage level that substantially equals a voltage drop across a parasitic resistance of the ground voltage of the tester and a voltage drop across the first resistor.

3. The system as claimed in claim 1, further comprising a test mode signal generator configured to output a signal to the multiplexer to indicate substantial voltage variation.

4. A semiconductor integrated circuit, comprising:
   a first ground pad connected to a ground voltage of a tester;
   a second ground pad connected between the tester and the first ground pad, the second ground pad being connected to the tester through first and second resistors;
   a reference voltage pad connected to a node between the first and second resistors; and
   a multiplexer connected to the reference voltage pad, the multiplexer configured to output a normal reference voltage or a test reference voltage as a reference voltage.

5. The semiconductor integrated circuit as claimed in claim 4, further comprising a test mode signal generator configured to output a signal to the multiplexer to indicate output of the test reference voltage as a reference voltage.

6. The semiconductor integrated circuit as claimed in claim 4, further comprising an internal voltage generating circuit configured to generate an internal voltage by comparing the internal voltage and the reference voltage.

7. The semiconductor integrated circuit as claimed in claim 4, wherein the tester is configured to provide current to the second ground pad for a burn-in test or a high-voltage margin evaluation of the semiconductor integrated circuit.

8. The semiconductor integrated circuit as claimed in claim 4, wherein the reference voltage pad has a voltage level that substantially equals a sum of a voltage drop across a parasitic resistance of the ground voltage and a voltage drop across the first resistor.

* * * * *